United States Patent
Lim

(10) Patent No.: US 12,432,912 B2
(45) Date of Patent: Sep. 30, 2025

(54) MASK-PROGRAMMABLE READ ONLY MEMORY WITH ELECTRICALLY ISOLATED CELLS

(71) Applicant: SK keyfoundry Inc., Cheongju-si (KR)

(72) Inventor: Mingyu Lim, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 230 days.

(21) Appl. No.: 17/531,864

(22) Filed: Nov. 22, 2021

(65) Prior Publication Data

US 2022/0384463 A1 Dec. 1, 2022

(30) Foreign Application Priority Data

Jun. 1, 2021 (KR) .................. 10-2021-0071069

(51) Int. Cl.
*H10B 20/00* (2023.01)
(52) U.S. Cl.
CPC .................. *H10B 20/38* (2023.02)
(58) Field of Classification Search
CPC .............. H10B 20/34; H10B 20/38
See application file for complete search history.

(56) References Cited

U.S. PATENT DOCUMENTS

| | | | |
|---|---|---|---|
| 6,512,276 B1 | 1/2003 | Tanaka | |
| 7,327,593 B2 | 2/2008 | Ostermayr et al. | |
| 7,645,672 B2 | 1/2010 | Kim | |
| 2004/0213029 A1* | 10/2004 | Hirata | G11C 17/12 365/104 |
| 2006/0198219 A1* | 9/2006 | Okano | G11C 17/12 257/E21.582 |
| 2008/0170426 A1 | 7/2008 | Liaw | |
| 2010/0226167 A1* | 9/2010 | Kajiyama | G11C 11/1675 365/158 |
| 2011/0069527 A1* | 3/2011 | Liaw | H01L 27/0207 365/104 |

FOREIGN PATENT DOCUMENTS

| | | |
|---|---|---|
| JP | 2004-327574 A | 11/2004 |
| JP | 2009-206473 A | 9/2009 |

OTHER PUBLICATIONS

Korean Office Action issued on Dec. 20, 2022, in counterpart Korean Patent Application No. 10-2021-0071069 (6 pages in English).
Korean Office Action issued on May 31, 2022, in the counterpart Korean Application No. 10-2021-0071069 (5pages in Korean).

* cited by examiner

*Primary Examiner* — Meiya Li
(74) *Attorney, Agent, or Firm* — NSIP Law

(57) ABSTRACT

A mask-programmable read only memory (ROM) is provided. The mask ROM includes first and second unit cells; an isolation gate electrode that isolates the first unit cell and the second unit cell; and a bit line that crosses the first and second unit cells. The first unit cell includes: a first source contact and a first bit line contact which are disposed on a semiconductor substrate; and a first gate electrode disposed between the first source contact and the first bit line contact. The second unit cell includes: a second source contact and a second bit line contact which are disposed on the semiconductor substrate; a second gate electrode disposed between the second source contact and the second bit line contact; and a via structure electrically connected to the second bit line contact. The bit line is connected to the via structure of the second unit cell.

12 Claims, 11 Drawing Sheets

MASK-PROGRAMMABLE READ ONLY MEMORY WITH ELECTRICALLY ISOLATED CELLS

CROSS-REFERENCE TO RELATED APPLICATION(S)

This application claims the benefit under 35 U.S.C. § 119 of Korean Patent Application No. 10-2021-0071069 filed on Jun. 1, 2021, in the Korean Intellectual Property Office, the entire disclosure of which is incorporated herein by reference for all purposes.

BACKGROUND

1. Field

The description relates to a mask-programmable read only memory (mask ROM).

2. Description of Related Art

Typically, a semiconductor memory device may be divided into a nonvolatile memory device in which stored data is not lost even when power supply is interrupted, and a volatile memory device in which stored data is lost when power supply is interrupted.

Additionally, in accordance with a method for storing data, the nonvolatile memory device is divided into a mask ROM in which data cannot be changed by a user and a programmable ROM (PROM), a one-time programmable ROM (OTPROM), an erasable programmable rom (EPROM), and an electrically erasable programmable PROM (EEPROM), etc., in which data can be changed by a user.

Among these non-volatile memory devices, the mask ROM may store data by coding, during a manufacturing process thereof, by using a mask having a data code desired by a user.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a mask-programmable read only memory (ROM) includes a first unit cell and a second unit cell; an isolation gate electrode, configured to isolate the first unit cell and the second unit cell; and a bit line, configured to cross the first unit cell and the second unit cell, wherein the first unit cell comprises: a first source contact disposed on a semiconductor substrate, and a first bit line contact disposed on the semiconductor substrate; and a first gate electrode disposed between the first source contact and the first bit line contact, wherein the second unit cell comprises: a second source contact disposed on the semiconductor substrate, and a second bit line contact disposed on the semiconductor substrate; a second gate electrode disposed between the second source contact and the second bit line contact; and a via structure electrically connected to the second bit line contact, wherein the bit line is connected to the via structure of the second unit cell.

The isolation gate electrode may be formed in a same operation as a formation of the first gate electrode and the second gate electrode, wherein the isolation gate electrode is configured to be connected to a ground power.

The isolation gate electrode may be disposed closer to the first bit line contact and the second bit line contact than to the first source contact and the second source contact.

The mask ROM may include a first metal wiring configured to be connected to the first bit line contact, and a second metal wiring configured to be connected to the second bit line contact, wherein the first metal wiring and the second metal wiring are configured to overlap with the first gate electrode and the second gate electrode, respectively.

The first metal wiring and the second metal wiring may not overlap with the isolation gate electrode.

The first unit cell may be disposed on a first active pattern, wherein the second unit cell is disposed on a second active pattern, wherein the bit line is disposed to overlap with the first active pattern and the second active pattern in a direction parallel to the first active pattern and the second active pattern, and wherein a width of the bit line is formed to be less than a width of the first active pattern and the second active pattern.

The mask ROM may further include first high concentration regions connected to the first source contact and the second source contact, respectively; second high concentration regions connected to the first bit line contact and the second bit line contact, respectively; and a first source line connected to the first source contact and a second source line connected to the second source contact, respectively.

In a general aspect, a mask-programmable read only memory (ROM) includes a plurality of cells, the mask ROM including an isolation structure, configured to isolate adjacent cells of the plurality of cells from each other, wherein the isolation structure includes: an insulating layer disposed on a semiconductor substrate; and an isolation gate electrode disposed on the insulating layer, wherein the isolation gate electrode is connected to a ground voltage.

An uninterrupted active pattern may be disposed between bit line contacts provided in each of the adjacent cells.

The isolation gate electrode may be formed in a same operation as a formation of other gate electrodes in the plurality of cells.

Each of the plurality of cells may include a unit cell, wherein the unit cell may include a bit line contact connected to a drain region; a word line formed of a gate electrode; and a source contact connected to a source region, and wherein the isolation gate electrode is disposed closer to the bit line contact than to the source contact.

The plurality of cells may include a first unit cell; a second unit cell; and a bit line, configured to cross the first unit cell and the second unit cell, wherein the first unit cell may include a first bit line contact connected to a first drain region; and a first metal wiring connected to the first bit line contact, wherein the first unit cell does not have a first via-structure between the bit line and the first metal wiring, wherein the second unit cell comprises: a second bit line contact connected to a second drain region; and a second metal wiring connected to the second bit line contact, and wherein the second unit cell is configured to have a second via-structure between the second bit line and the second metal wiring.

The isolation structure may include a first isolation and a second isolation which are adjacent to each other, wherein the isolation structure may include two bit line contacts disposed between the first isolation and the second isolation; two word lines disposed between the first isolation and the second isolation; and one common source contact disposed between the two word lines.

The two bit line contacts and the common source contact are disposed on an active pattern, and wherein the active pattern is configured to have a stripe shape.

In a general aspect, a mask-programmable read only memory (ROM), includes a first cell including a first gate electrode; a second cell including a second gate electrode; a bit line; a shallow trench structure, disposed between the first cell and the second cell; wherein the first cell is spatially separated from the bit line, and wherein the second cell is connected to the bit line by a via structure.

The first cell may include a first source contact, connected to a first source region; a first bit line contact, connected to a first drain region; a first insulating structure, disposed on a substrate, and wherein the first gate electrode is disposed on the first insulating structure.

The second cell may include a second source contact, connected to a second source region; a second bit line contact, connected to a second drain region and the via structure; and a second insulating structure, disposed on the substrate, wherein the second gate electrode is disposed on the first insulating structure.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
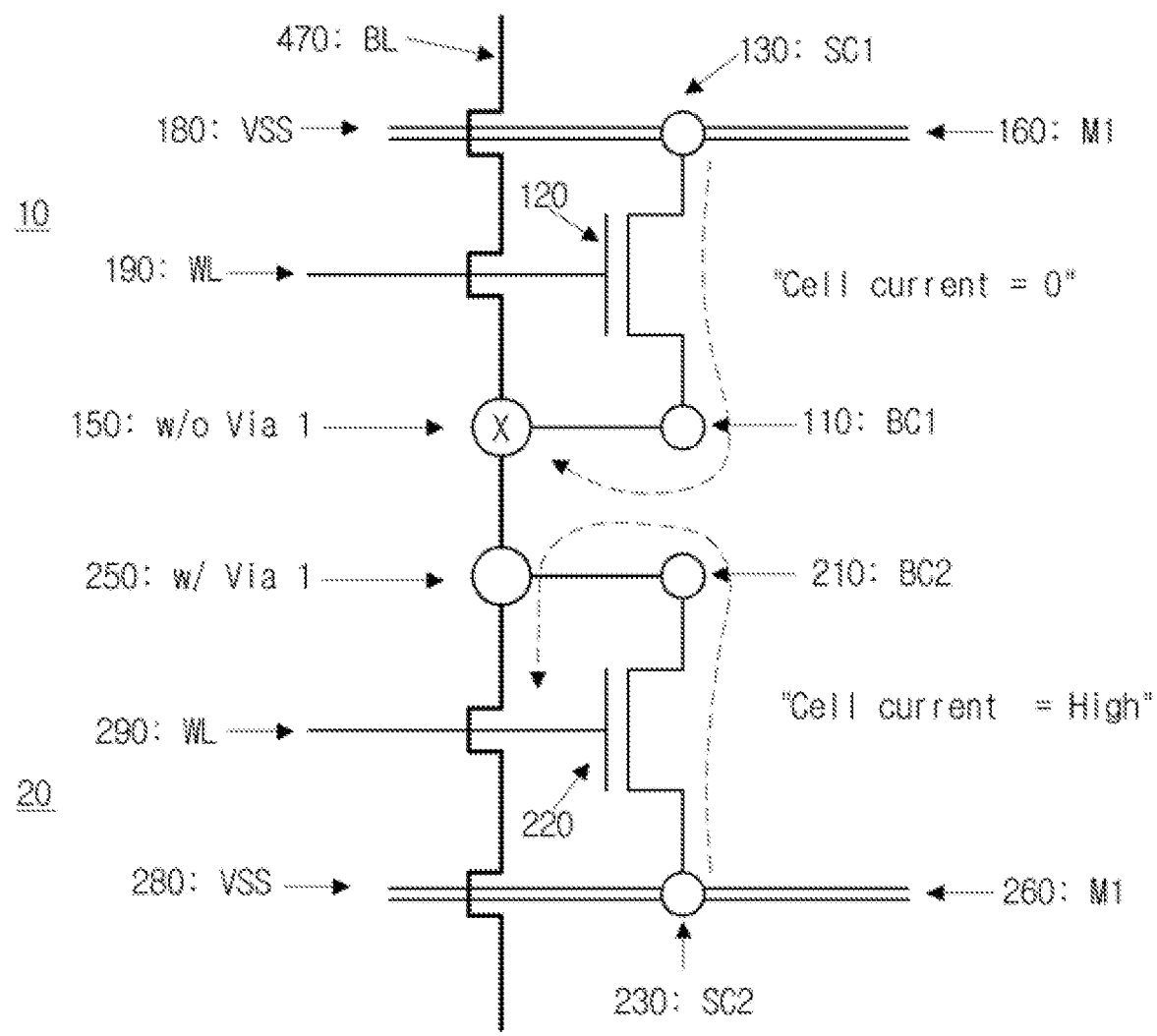
FIG. 1 illustrates a layout of an example mask ROM bit cell, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

Throughout the specification, when an element, such as a layer, area, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, areas, layers, or sections, these members, components, areas, layers, or sections are not to be limited by these terms. Rather, these terms are only used to distinguish one member, component, area, layer, or section from another member, component, area, layer, or section. Thus, a first member, component, area, layer, or section referred to in examples described herein may also be referred to as a second member, component, area, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include varies in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

The mask ROM may be characterized in that adjacent cells are electrically isolated by using a gate electrode connected to a ground power FIG. 1 illustrates an example layout of a mask-programmable read only memory (ROM) bit cell, in accordance with one or more embodiments.

In an example, the mask ROM cell may implement a via coding method as illustrated in FIG. 1. The coding of the mask ROM cell is performed based on the presence or absence of a first via pattern (Via 1).

Referring to FIG. 1, the mask ROM cell, in accordance with one or more embodiments, may include two adjacent unit cells 10 and 20. First, the respective first unit cell 10 and second unit cell 20 includes transistors. The respective unit cells 10 and 20 may have a first bit line contact (BC1) 110 and a second bit line contact (BC2) 210, a first gate electrode 120 and a second gate electrode 220, and a first source contact (SC1) 130 and a second source contact (SC2) 230.

Additionally, a first source line 160 and a second source line 260 connected to the respective first and second source contacts (SC1 and SC2) 130 and 230 may respectively be formed. Additionally, a bit line 410, may be connected with a first via 150 and a second via 250. The respective first and second source lines 160 and 260 and the bit line 410 may be perpendicular to each other.

Here, FIG. 1 illustrates that the first via 150 may not be formed by the via coding method. The second via 250 may be formed in the second unit cell 20. Thus, the bit line (M2) 410 may be electrically connected to the second via 250 in the second unit cell 20.

Additionally, respective first and second source lines (VSS) 180 and 280, respective first and a second word lines (WL) 190 and 290, and the bit line (BL) 410 may be formed in each cell. A metal wiring M1, connected to the respective first and second source contacts (SC1 and SC2) 130 and 230, corresponds to the respective first and second source lines (VSS) 180 and 280. The respective first and second gate electrodes 120 and 220 corresponds to the respective first and second word lines (WL) 190 and 290. A metal wiring M2 corresponds to the bit line (BL) 410.

In the second unit cell 20, the bit line 410 and the bit line contact BC2 may be electrically connected to each other through the structure of the second via 250. Thus, as a path (dotted arrow) through which a current can flow is formed, the second unit cell 20 becomes a state of "1".

On the other hand, the first unit cell 10 may not be electrically connected to the bit line 410 and the bit line contact BC1. This is because the structure of the first via 150 is not formed. Even when the first unit cell 10 is selected, the first unit cell 10 becomes a state of "0" in which no current flows.

Accordingly, the states of "1" and "0" of the bit cell are distinguished by the "presence and absence" of the first and second vias 150 and 250, so that the unit cells serve as a memory cell that writes data.

Figure 2A:
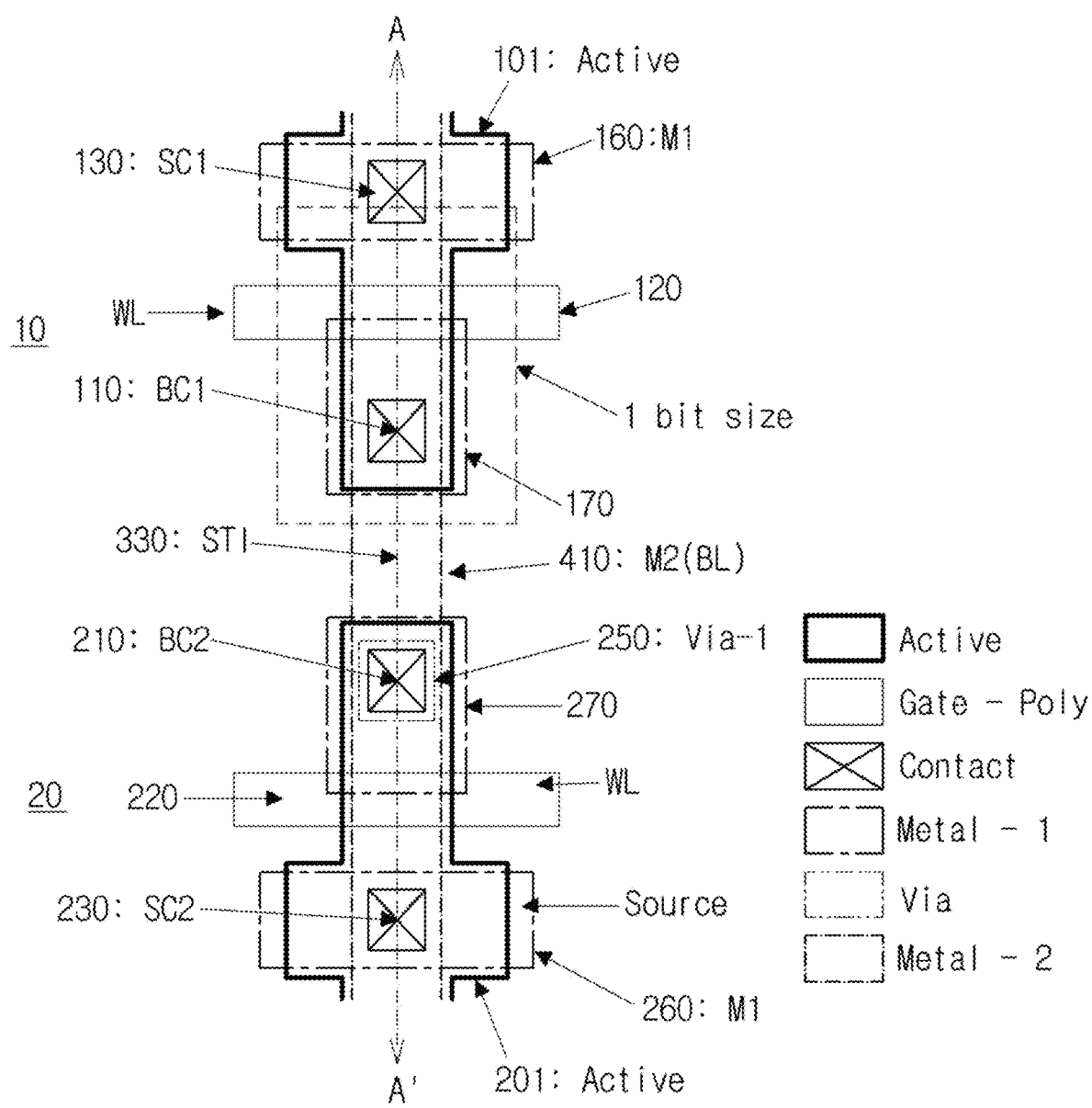
FIGS. 2A and 2B illustrate an example layout of an example mask ROM bit cell as shown in FIG. 1, in accordance with one or more embodiments.
Figure 2B:
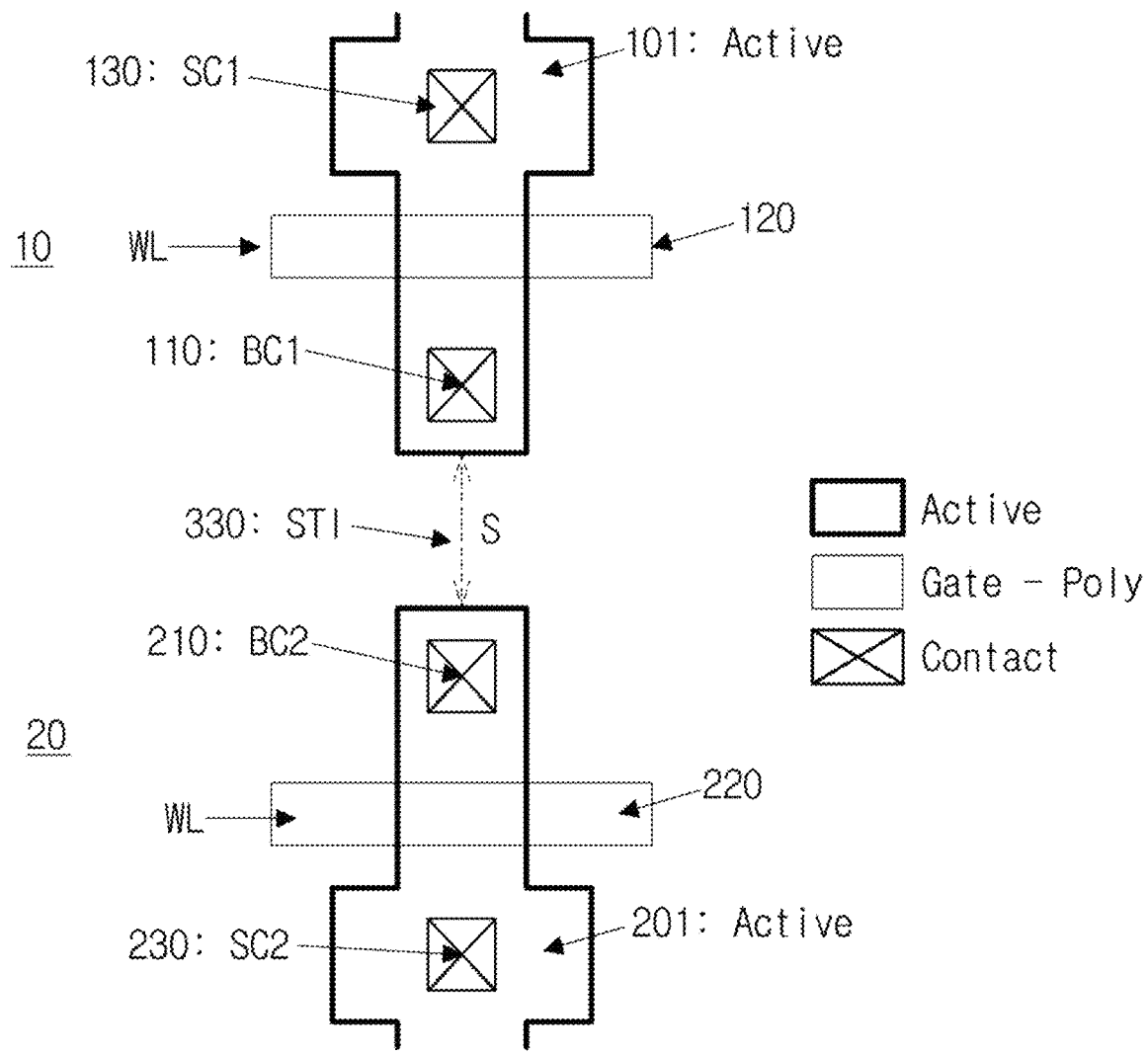

FIGS. 2A and 2B illustrate an example layout of the mask ROM bit cell as shown in FIG. 1.

Referring to FIG. 2A, a shallow trench structure (STI) 330 is formed so as to distinguish active regions 101 and 201 from each other. The gate electrodes 120 and 220 are formed on the active patterns 101 and 201, and the first and second source contacts (SC1 and SC2) 130 and 230 and the first and second bit line contacts (BC1 and BC2) 110 and 210 are formed on both sides of the active patterns 101 and 201. Accordingly, one bit cell 10 and 20 is created. One MOSFET may be formed in the first and second unit cells 10 and 20, respectively.

The first and second source lines 160 and 260 electrically connected to the first and second source contacts (SC1 and SC2) 130 and 230 may be formed, respectively. Additionally, first and second metal wirings 170 and 270 electrically connected to the first and second bit line contacts (BC1 and BC2) 110 and 210 may be formed, respectively. The first and second metal wirings 170 and 270 may be implemented as landing pads of the first via 150 and the second via 250, respectively. As illustrated in FIG. 2A, the first via 150 is not formed on the first metal wiring 170. However, the second via 250 is formed on the second metal wiring 270. That is, the first via 150 is not formed in the first unit cell. However, the second via 250 is formed in the second unit cell 20.

The bit line 410 electrically connected to the second via 250 may be formed. M2 is used as the bit line 410. The bit line 410 may be formed in a direction parallel to the active patterns 101 and 201.

FIG. 2B illustrates an example layout of the mask ROM cell without the first and second metal wirings 170 and 270 and the bit line 410 in FIG. 2A.

Referring to FIG. 2B, isolation between the respective mask ROM cells may be achieved by a field oxide layer such as the STI 330. The STI 330 isolates the first and second active regions 101 and 201 from a field region.

In an example, the first unit cell 10 and the second unit cell 20, which are adjacent to each other, may be isolated by an isolation pattern (STI) by a distance S.

Figure 3:
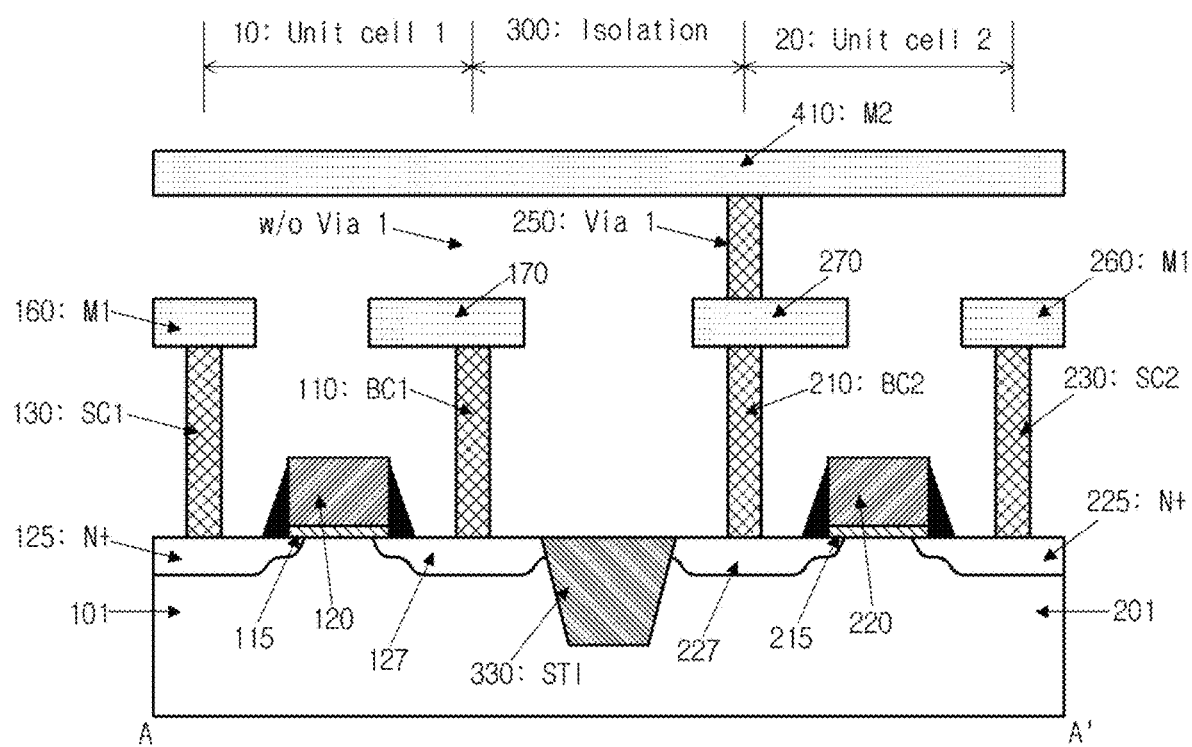
FIG. 3 illustrates an example cross sectional view of an example mask ROM bit cell taken along line A-A' in FIG. 2A, in accordance with one or more embodiments.

FIG. 3 illustrates an example cross sectional view of an example mask ROM bit cell taken along line A-A' in FIG. 2A, in accordance with one or more embodiments.

Referring to FIG. 3, the shallow trench structure (STI) 330 may be implemented as an isolation structure 300 between the respective first and second unit cells 10 and 20, which are disposed adjacent to each other. Therefore, the STI 330 may be formed between the first gate electrode 120 and the second gate electrode 220, and thus, the two unit cells 10 and 20 may be electrically isolated. Respective gate insulating layers 115 and 215 are formed on a substrate under the respective first and second gate electrodes 120 and 220. Additionally, respective first high concentration N-type doped regions (N+) 125 and 225, which are implemented as a source region, may be formed in the first and second active regions 101 and 201 around the gate electrode. The first and second source contacts 130 and 230 are connected to the first high concentration N-type doped regions (N+) 125 and 225, respectively. The first and second source lines 160 and 260 are respectively connected to the first and second source contacts 130 and 230.

Additionally, second high concentration N-type doped regions (N+) 127 and 227, which may be implemented as a drain region, may be further formed on the substrate. The first and second bit line contacts (BC1 and BC2) 110 and 210 may be respectively connected to the second high concentration N-type doped regions (N+) 127 and 227.

The first and second metal wirings 170 and 270 are connected to the first and second bit line contacts (BC1 and BC2) 110 and 210, respectively. Additionally, the bit line 410 may be continuously formed over the first and second metal wirings 170 and 270.

In the first unit cell 10, the first via 150, in which the first metal wiring 170 and the bit line 410 are electrically connected to each other, is not formed. Although in FIG. 3 the bit line 410 is elongated, the bit line 410 may not be electrically connected to the first bit line contact (BC1) 110 or the drain region 127 because in the first unit cell 10, the first via, Via 1, is not implemented under the bit line 410. The first bit line contact (BC1) 110 of the first unit cell 10 is in a floating state. However, in the second unit cell 20, the second via 250, in which the second metal wiring 270 and the bit line 410 are electrically connected to each other, may be formed.

Figure 4A:
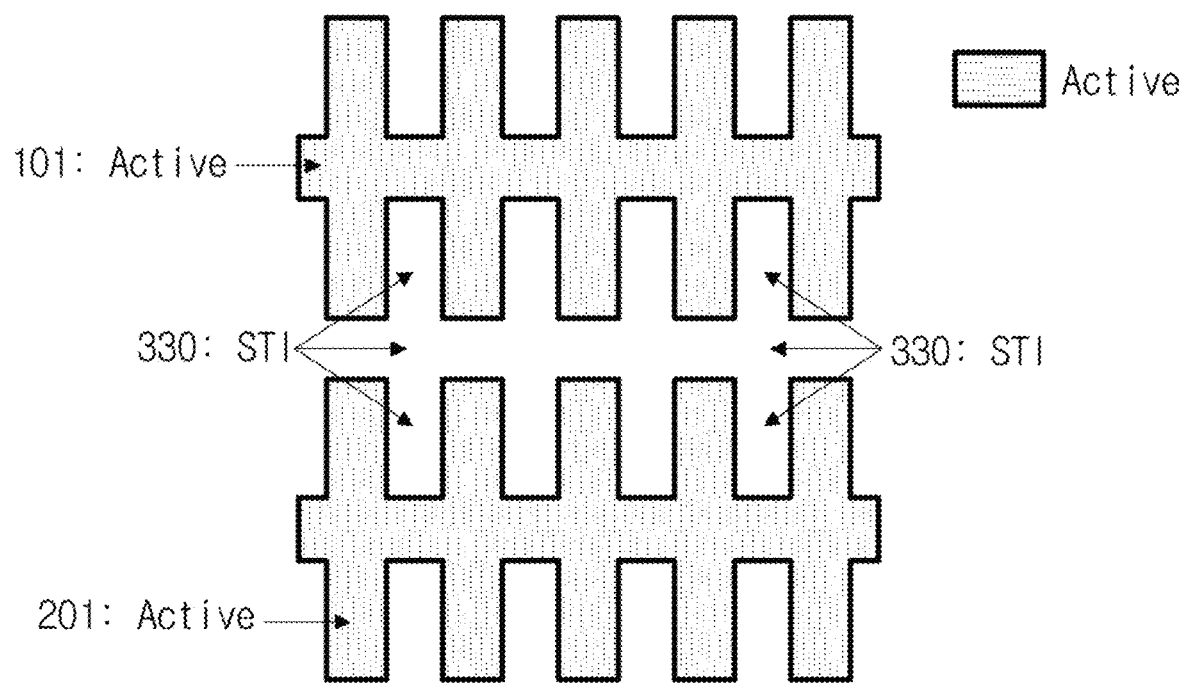
FIG. 4A illustrates schematically an example isolation pattern of an arrangement of an example mask ROM bit cell as shown in FIGS. 2A and 2B, in accordance with one or more embodiments.
Figure 4B:
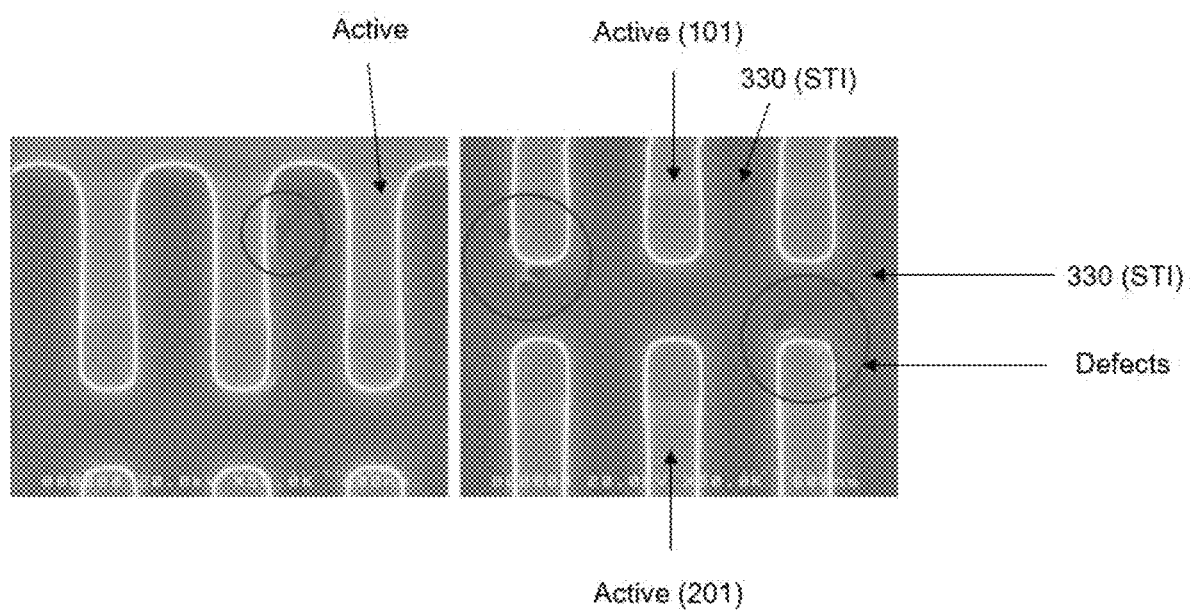
FIG. 4B illustrates a defect occurrence image in an example arrangement of an example mask ROM bit cell as shown in FIG. 4A, in accordance with one or more embodiments.

FIGS. 4A and 4B illustrate the isolation pattern of the arrangement of the mask ROM bit cell as shown in FIGS. 2A and 2B.

Referring to FIG. 4A, when viewed from a cell array, the STI 330, which is an isolation region, exists between the first active region 101 and the second active region 201. The first active region 101 and the second active region 201 may be formed to have a plurality of protrusions. The STI 330 also exists between the protrusion and the protrusion.

FIG. 4B shows a defect occurrence image in the arrangement of the mask ROM bit cell as shown in FIG. 4A.

As illustrated in FIG. 4B, a stress induced defect (hereinafter, SID) type defect has occurred in the STI 330 (e.g., isolation region), which exists between respective first protrusions and respective second protrusions. In a shallow trench isolation (STI) process or a medium trench isolation (MTI) process, stress may be concentrated in a position where a trend isolation pattern is bent or angled, therefore causing the stress induced defect (SID) (hereinafter, SID). This may result in junction leakage failure, which is a major cause of reducing yield of a semiconductor device.

In order to reduce such occurrence of the SID, it may be beneficial if the distance S between cells adjacent to each other is increased in FIG. 2B. However, the increase in the spaced distance between adjacent cells eventually results in an increase in the bit cell size. Therefore, when a ROM density increases, the size of the entire semiconductor chip increases.

Figure 5A:
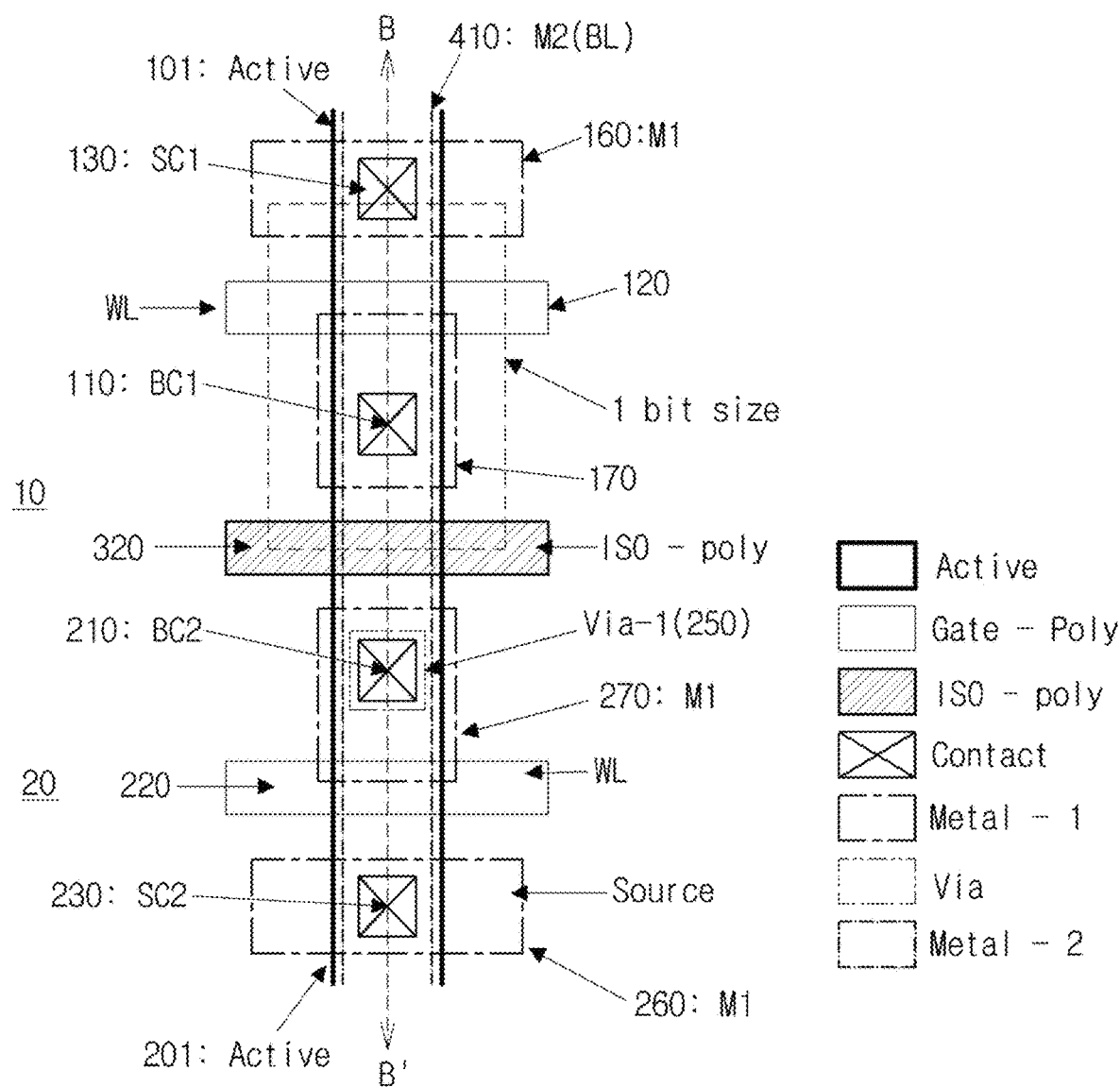
FIGS. 5A and 5B illustrate an example layout of an example mask ROM bit cell, in accordance with one or more embodiments.
Figure 5B:
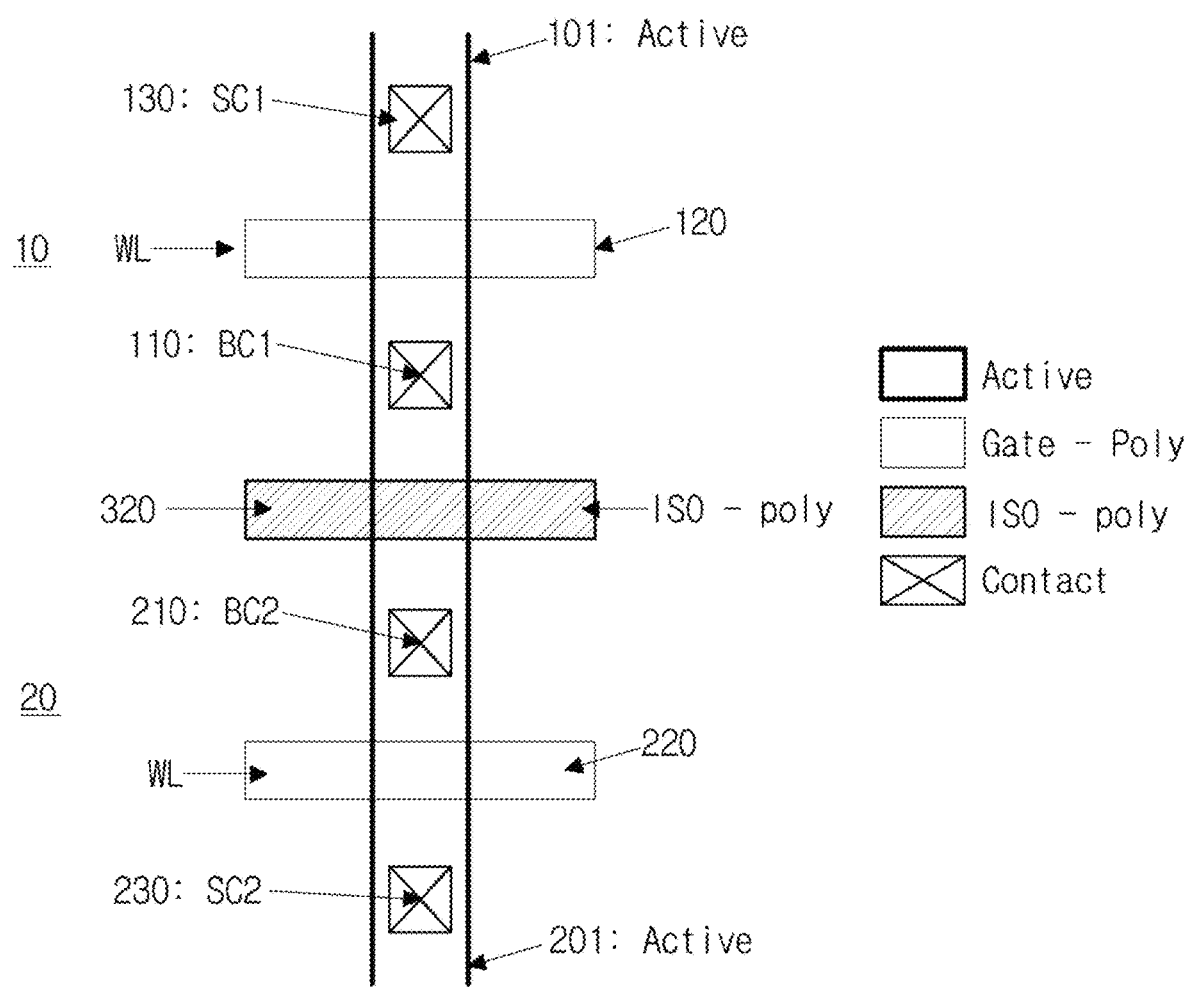

FIGS. 5A and 5B illustrate an example layout of an example mask ROM bit cell, in accordance with one or more embodiments.

Referring to FIG. 5A, the gate electrodes 120 and 220 may be formed on the active patterns 101 and 201, and the first and second source contacts (SC1 and SC2) 130 and 230 and the first and second bit line contacts (BC1 and BC2) 110 and 210 may be formed on both sides of the active patterns 101 and 201. Accordingly, individual respective bit cells 10 and 20 are created. One MOSFET may be formed in the first and second unit cells 10 and 20, respectively.

The first and second source lines 160 and 260, which are electrically connected to the first and second source contacts (SC1 and SC2) 130 and 230, may be formed, respectively. Additionally, first and second metal wirings 170 and 270, electrically connected to the first and second bit line contacts (BC1 and BC2) 110 and 210, may be formed, respectively. The first and second metal wirings 170 and 270 may be implemented as landing pads of the first via 150 and the second via 250, respectively. In an example, the first and second source lines 160 and 260, and the first and second metal wirings 170 and 270, may all be formed in the same process step. In a non-limited example, the first and second source lines 160 and 260 and the first and second metal wirings 170 and 270 may comprise low-resistance metal components such as Al or Cu.

In an example, the first via 150 is not formed on the first metal wiring 170. However, the second via 250 is formed on the second metal wiring 270. That is, the first via 150 is not formed in the first unit cell. However, the second via 250 is formed in the second unit cell 20.

Additionally, the bit line 410 electrically connected to the second via 250 is formed. M2 is used as the bit line 410. The bit line 410 is formed in a direction parallel to the active patterns 101 and 201. However, the bit line 410 may be perpendicular to the first and second source lines 160 and 260.

In the example mask ROM, the first and second bit line contacts (BC1 and BC2) 110 and 210 are isolated by an isolation gate electrode 320. The isolation gate electrode 320 may be also called as a dummy gate electrode. The isolation gate electrode 320 (e.g., the dummy gate electrode) may be connected to a ground voltage or a ground power. Additionally, in the example mask ROM, around the first and second source contacts (SC1 and SC2) 130 and 230, an active pattern may not be formed to extend in a left and right direction. The first and second bit line contacts (BC1 and BC2) are formed around the isolation gate electrode 320. Further, the first and second gate electrodes 120 and 220 are formed next to the first and second bit line contacts (BC1 and BC2). Additionally, the first and second source contacts (SC1 and SC2) are formed next to the first and second gate electrodes 120 and 220. The first and second bit line contacts (BC1 and BC2) are disposed closer to the isolation gate electrode 320 than the first and second source contacts (SC1 and SC2).

Additionally, the first and second source lines 160 and 260, connected to the first and second source contacts (SC1 and SC2) respectively, do not overlap the first and second gate electrodes 120 and 220. However, the first and second metal wirings 170 and 270 connected to the first and second bit line contacts (BC1 and BC2) may overlap the first and second gate electrodes 120 and 220. In this example, the first and second metal wirings 170 and 270 may be implemented as a field plate to reduce an electric field of the first and second gate electrodes 120 and 220. However, the first and second metal wirings 170 and 270 do not overlap the isolation gate electrode 320.

As shown in FIG. 5A, the first and second active patterns 101 and 201 formed in the first unit cell 10 and the second unit cell 20 are formed up and down in a vertical direction without interruption from each other. Additionally, the bit line 410 connected to the second via 250 is formed to overlap with the first and second active patterns 101 and 201 in a direction parallel to the first and second active patterns 101 and 201. Additionally, the width of the bit line 410 is formed to be less than the width of the first and second active patterns 101 and 201.

Referring to FIG. 5A, the mask ROM, in accordance with one or more embodiments, is different from the mask ROM of FIGS. 2 to 4 in which the SID occurs, in that the active patterns 101 and 201 continue without interruption between the first and second bit line contacts (BC1 and BC2) 110 and 210. As described above, the SID occurrence problem in the example mask ROM is because the trench-type field oxide layer is used in the isolation structure 300 between adjacent cells. As a result, active patterns having protrusion patterns are formed, and defects such as the SID occur between the active patterns.

Referring to FIG. 5B, isolation between adjacent bit cell will be described as follows. The isolation gate electrode 320 (e.g., poly-Si (ISO-poly)) is formed in the same manner as the previously described first and second gate electrodes 120 and 220 (FIG. 1). When the gate electrode of the MOSFET for isolation is connected to Ground (ground power), a junction area under the first bit line contact (BC1) 110 and a junction area under the second bit line contacts (BC2) 210 are electrically isolated from each other.

In the first and second unit cells 10 and 20, a distance between the isolation gate electrode 320 (e.g., poly-Si (ISO-poly)) and the first and second bit line contacts (BC1 and BC2) can be drawn by a minimum design rule, so that it is possible to much reduce the cell size compared to the size of a conventional mask ROM cell.

Figure 6:
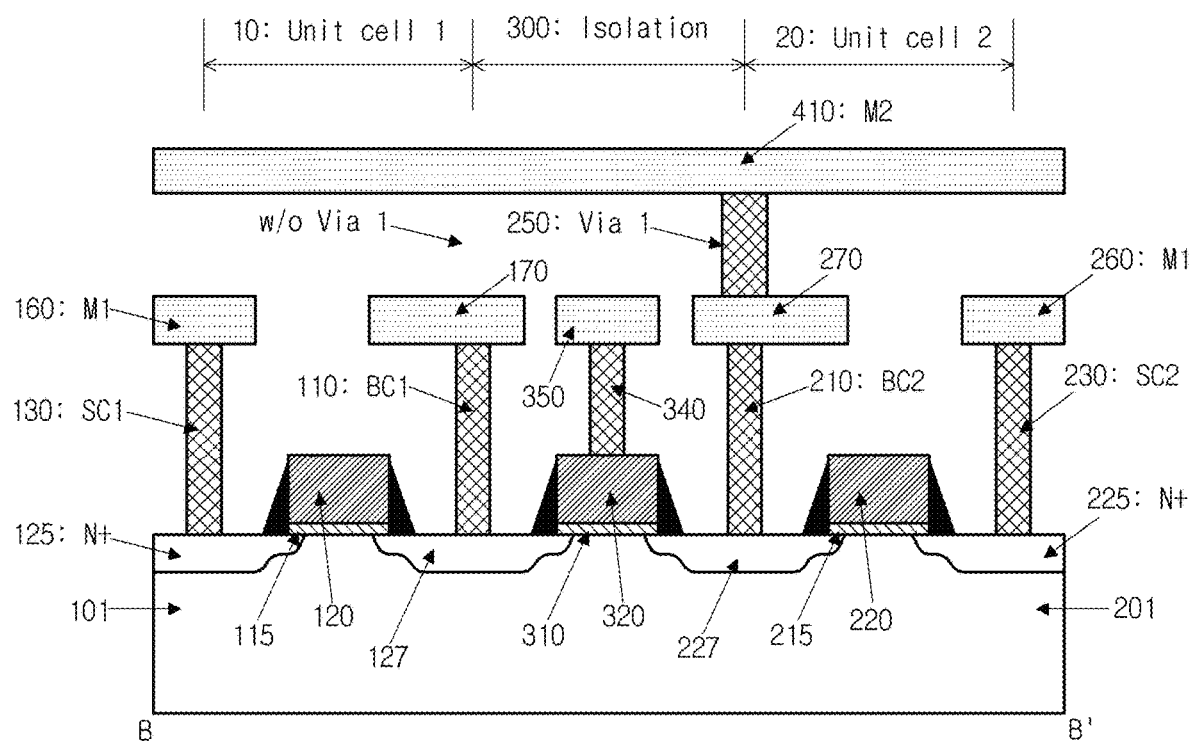
FIG. 6 illustrates an example cross sectional view of an example mask ROM bit cell taken along line B-B' in FIG. 5A, in accordance with one or more embodiments.

FIG. 6 illustrates an example cross sectional view of an example mask ROM bit cell taken along line B-B' in FIG. 5A, in accordance with one or more embodiments.

Referring to FIG. 6, between the first and second unit cells 10 and 20 disposed adjacent to each other, an insulating layer 310 formed on the substrate in the form of the isolation structure 300 and the isolation gate electrode 320 formed on the insulating layer are used. The isolation gate electrode 320 may be connected by a gate contact (not shown) and may be connected to a ground voltage or a ground power through a metal wiring (not shown). Therefore, the isolation gate electrode 320 electrically isolates two adjacent MOSFETs 10 and 20. The insulating layer 310 may be formed together with the gate insulating layers 115 and 215. A gate structure similar to the structure of the adjacent MOSFETs 10 and 20 is formed by stacking the insulating layer 310 and the isolation by poly-Si (shortened to ISO-poly) 320.

Referring to FIG. 6, the mask ROM, in accordance with one or more embodiments, is different from the mask ROM according to the example of FIGS. 2 to 4 in that the first and second active patterns 101 and 201 continue without interruption between the first and second bit line contacts (BC1 and BC2) 110 and 210.

The first and second gate insulating layers 115 and 215 are formed on the substrate under the first and second gate electrodes 120 and 220. Also, the first high concentration N-type doped regions (N+) 125 and 225 which are used as a source region may be formed in the first and second active regions 101 and 201 around the gate electrode. The first and second source contacts 130 and 230 are connected to the first high concentration N-type doped regions (N+) 125 and 225, respectively. The first and second source lines 160 and 260 are connected to the first and second source contacts 130 and 230, respectively.

Additionally, the second high concentration N-type doped regions (N+) 127 and 227 which are implemented as a drain region are further formed on the substrate. The first and second bit line contacts (BC1 and BC2) 110 and 210 are connected to the second high concentration N-type doped regions (N+) 127 and 227, respectively. The first and second metal wirings 170 and 270 are connected to the first and second bit line contacts (BC1 and BC2) 110 and 210, respectively. Then, subsequently, the second via 250 in the second unit cell 20 is connected to the second metal wiring 270. However, the first via 150 electrically connected to the first bit line contact (BC1) 110 is not implemented in the first unit cell 10. Accordingly, the electrical flow is interrupted. Although the bit line 410 is elongated, the bit line 410 may not be electrically connected to the drain region 127 because the first via Via 1 is not implemented under the bit line 410. Accordingly, the first bit line contact 110 of the first unit cell 10 is in a floating state.

Figure 7:
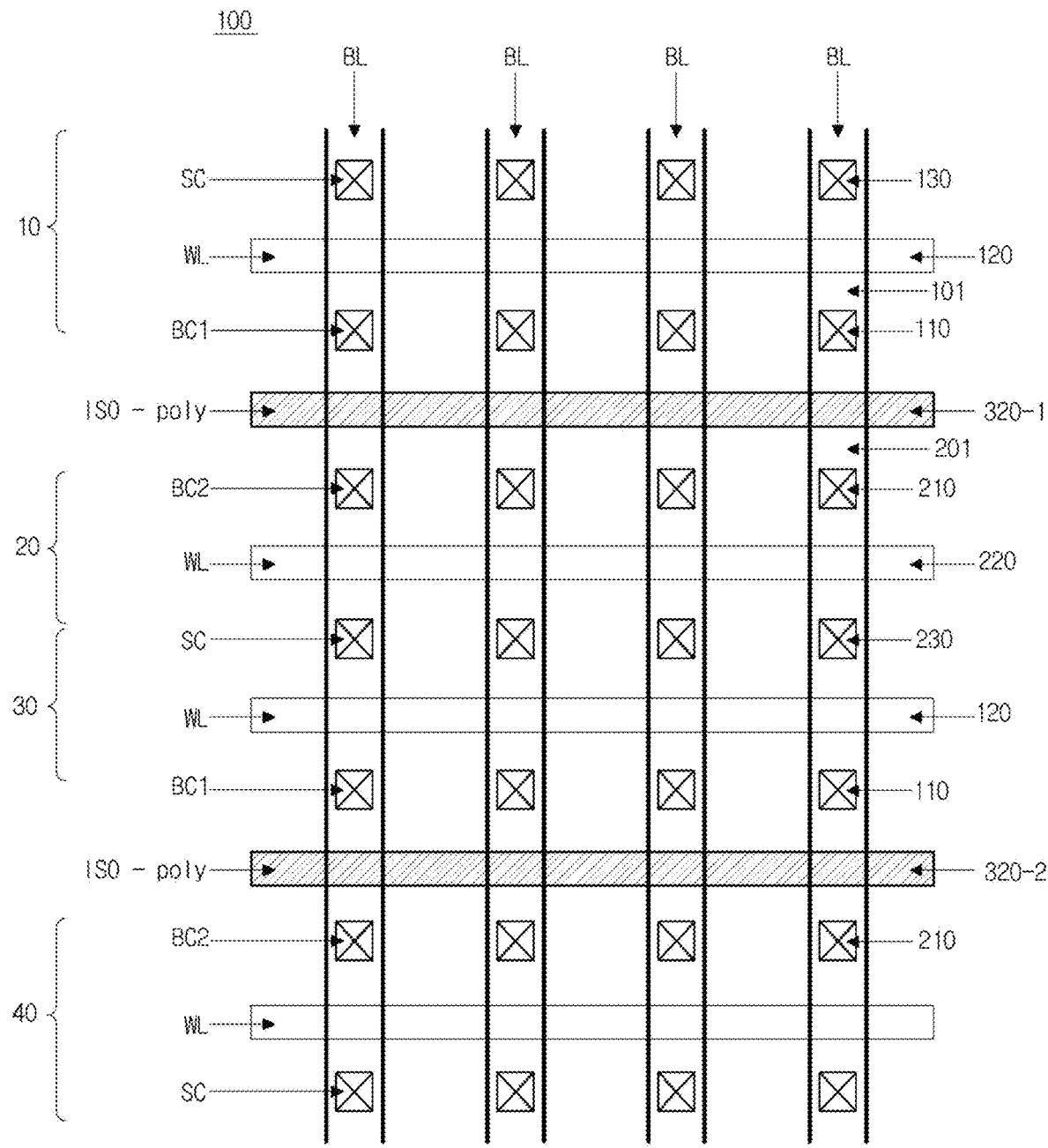
FIG. 7 illustrates a plurality of cell layouts of an example mask ROM, in accordance with one or more embodiments.

FIG. 7 illustrates an example layout of the mask ROM bit cell array, in accordance with one or more embodiments.

Referring to FIG. 7, in the example layout of the mask ROM bit cell array 100 according to the example, the plurality of unit cells 10, 20, 30, and 40 and the isolation structure (ISO-poly) are repeatedly formed. In an example, the isolation structure (ISO-poly) may include a plurality of first isolations or first isolation gate electrode 320-1 and a plurality of second isolations or second isolation gate electrode 320-2.

In the mask ROM bit cell array 100 according to an example, a plurality of the first unit cells 10, the first isolation gate electrode 320-1, a plurality of the second unit cells 20, a plurality of third unit cells 30, the second isolation gate electrode 320-2, and a plurality of fourth unit cells 40 are formed.

In an example, the first isolation gate electrode 320-1 may be formed between the plurality of first unit cells 10 and the plurality of second unit cells 20. On the other hand, a long isolation structure (ISO-poly) may not be formed between the plurality of second unit cells 20 and the plurality of third unit cells 30. Then, the second isolation gate electrode 320-2 may be formed between the plurality of third unit cells 30 and the plurality of fourth unit cells 40. The mask ROM bit cell array 100 can be formed by repeating the above structure.

First, the plurality of first and third unit cells 10 and 30 may have the same structure. In an example, each of the odd-number unit cells 10 and 30 may comprise the first source contact (SC) 130, the first long word line (WL) 120 using the first gate electrode 120, and the first bit line contact (BC1) 110. Similarly, the plurality of second and fourth unit cells 20 and 40 may also have the same structure. Each of the even-number unit cells 20 and 40 may comprise the second source contact (SC) 230, the second long word line (WL) 220 using the second gate electrode 220, and the second bit line contact (BC2) 210.

In an example, a plurality of the first source contacts (SC) 130, a plurality of the second source contacts (SC) 230, a plurality of the first bit line contacts (BC1) 110, and a plurality of the second bit line contact (BC2) 210 may all be arranged parallel to each other in an X-axis direction. Additionally, the first word line (WL) 120 may be disposed between the plurality of first source contacts (SC) 130 and the plurality of first bit line contacts (BC1) 110. Similarly, the second word line (WL) 220 may be disposed between the plurality of second source contacts (SC) 230 and the plurality of second bit line contacts (BC2) 210.

Additionally, the first isolation gate electrode 320-1 may be disposed between the plurality of first bit line contacts (BC1) 110 and the plurality of second bit line contacts (BC2) 210. Likewise, the second long isolation gate electrode 320-2 may also disposed between the plurality of first bit line contacts (BC1) 110 and the plurality of second bit line contacts (BC2) 210.

Additionally, the third unit cell 30 immediately adjacent to the second unit cell 20 is formed. The isolation structure (ISO-poly) may not be formed between the second unit cell 20 and the third unit cell 30 immediately adjacent to the second unit cell 20. Instead, it is characterized that the plurality of source contacts (SC) 130 and 230 may be used as a common source region for the second unit cell 20 and the third unit cell 30.

The plurality of first bit line contacts (BC1) 110, the plurality of first and second elongated word line (WL) 120 and 220, the plurality of the second source contacts (SC) 230 may be included between the first isolation 320-1 and the second isolation 320-2 adjacent to each other. The plurality of common source contacts (SC) 130 and 230 may be positioned in the center in one direction (X-axis).

A plurality of the long bit lines (BL) may be formed to cross each unit cell in an up and down direction (Y-axis direction). The plurality of long bit lines (BL) proceed in the up and down direction (Y-axis direction), and the plurality of long word lines (WL) 120 and 220 proceed in a left and right direction (X-axis direction). Accordingly, they can meet while crossing each other. Additionally, they may show a vertical relationship with each other. In an example, the plurality of long word lines (WL) 120 and 220 refer to the gate electrodes 120 and 220, respectively. A source line (not shown) connected to the common source contacts (SC) 130 and 230 may respectively exist between the two gate electrodes 120 and 220. Therefore, one source line (not shown) is disposed on the two gate electrodes 120 and 220.

Figure 8:
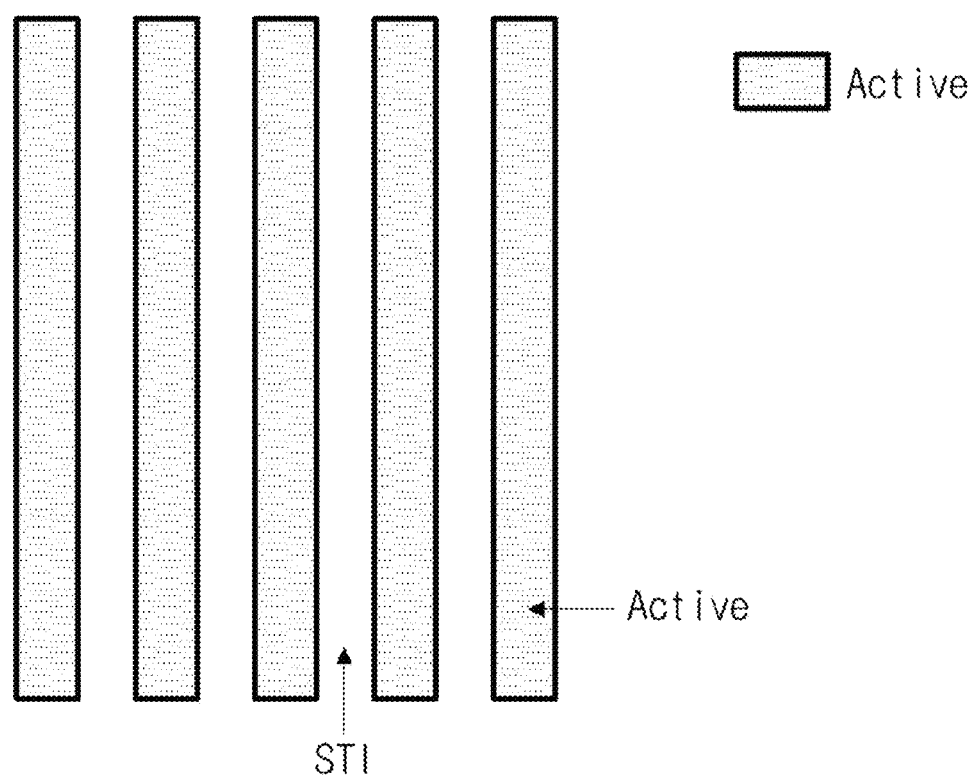
FIG. 8 illustrates an isolation between an example ROM bit cell, in accordance with one or more embodiments.

FIG. 8 shows schematically the isolation between the mask ROM bit cells according to the embodiment of the present invention.

Referring to FIG. 8, the active pattern in the ROM cell array of the examples continues in a stripe-shape pattern by the above change. Unlike the example of FIG. 4, the trench-type isolation structure may not be implemented, so that defects such as the SID may not occur.

While this disclosure includes specific examples, it will be apparent after an understanding of the disclosure of this application that various varies in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A mask-programmable read only memory (ROM), comprising:
   a first unit cell and a second unit cell;
   an isolation gate electrode configured to isolate the first unit cell and the second unit cell; and
   a bit line configured to cross the first unit cell and the second unit cell,
   wherein the first unit cell comprises:
   a first source region and a first drain region disposed in a semiconductor substrate;
   a first gate electrode disposed between the first source region and the first drain region;
   a first source contact disposed on the first source region;
   a first bit line contact disposed on the first drain region; and
   a first metal wiring in contact with the first bit line contact, wherein the first metal wiring extends to overlap a portion of the first gate electrode and does not fully cross the first gate electrode, such that the first metal wiring does not overlap the first source region,
   wherein there is no via structure connecting the first metal wiring to the bit line, such that there is no electrical connection between the first drain region and the bit line,
   wherein the second unit cell comprises:
   a second source region and a second drain region disposed in the semiconductor substrate;
   a second gate electrode disposed between the second source region and the second drain region;
   a second source contact disposed on the second source region;
   a second bit line contact disposed on the second drain region;
   a second metal wiring in contact with the second bit line contact, wherein the second metal wiring extends to overlap a portion of the second gate electrode and does not fully cross the second gate electrode, such that the second metal wiring does not overlap the second source region; and
   a via structure connecting the second metal wiring to the bit line, wherein the via structure is electrically connected to the second drain region, the second bit line contact, the second metal wiring, and the bit line, and
   wherein the bit line is disposed to overlap each of the first bit line contact, the second bit line contact, the first source contact, and the second source contact.

2. The mask-programmable ROM of claim 1,
   wherein the isolation gate electrode is formed of the same material as the first gate electrode and the second gate electrode, and
   wherein the isolation gate electrode is configured to be connected to a ground potential.

3. The mask-programmable ROM of claim 1,
   wherein the isolation gate electrode is disposed closer to the first bit line contact and the second bit line contact than to the first source contact and the second source contact.

4. The mask-programmable ROM of claim 1, further comprising:
   an active region overlapped with the first bit line contact, the second bit line contact, the first source contact and the second source contact,
   wherein each width of the bit line and the active region is greater than each width of the first bit line contact, the second bit line contact, the first source contact and the second source contact.

5. The mask-programmable ROM of claim 1,
   wherein the first unit cell is disposed on a first active pattern,
   wherein the second unit cell is disposed on a second active pattern,
   wherein the bit line is disposed to overlap with the first active pattern and the second active pattern in a direction parallel to the first active pattern and the second active pattern, and
   wherein a width of the bit line across the first unit cell and the second unit cell is less than a width of the first active pattern and a width of the second active pattern across the first unit cell and the second unit cell.

6. The mask-programmable ROM of claim 1, further comprising:
   a first source line connected to the first source contact; and
   a second source line connected to the second source contact.

7. The mask-programmable ROM of claim 1,
wherein a width of the via structure is greater than a width of the second bit line contact.

8. A mask-programmable read only memory (ROM), comprising:
- a first gate electrode configured to form a first word line;
- a second gate electrode configured to form a second word line;
- an isolation gate electrode disposed between the first gate electrode and the second gate electrode, the isolation gate electrode being configured to electrically isolate the first gate electrode from the second gate electrode;
- a first source region disposed adjacent to the first gate electrode;
- a second source region disposed adjacent to the second gate electrode;
- a first drain region disposed between, and overlapping with, the first gate electrode and the isolation gate electrode;
- a second drain region disposed between, and overlapping with, the isolation gate electrode and the second gate electrode;
- a first source contact disposed in a semiconductor substrate and electrically connected to the first source region;
- a second source contact disposed in the semiconductor substrate and electrically connected to the second source region;
- a first bit line contact disposed on the semiconductor substrate and electrically connected to the first drain region;
- a second bit line contact disposed on the semiconductor substrate and electrically connected to the second drain region;
- a first metal wiring connected to the first bit line contact, wherein the first metal wiring extends to overlap a portion of the first gate electrode and does not fully cross the first gate electrode, such that the first metal wiring does not overlap the first source region;
- a second metal wiring connected to the second bit line contact, wherein the second metal wiring extends to overlap the second gate electrode and does not overlap the second source region;
- a bit line configured to cross the first gate electrode, the second gate electrode, and the isolation gate electrode; and
- a via structure connecting the second metal wiring to the bit line, such that the via structure is electrically connected to the second drain region, the second bit line contact, the second metal wiring, and the bit line,
- wherein the bit line is disposed to overlap each of the first bit line contact, the second bit line contact, the first source contact, and the second source contact, and
- wherein there is no via structure connecting the first metal wiring to the bit line, such that there is no electrical connection between the first drain region and the bit line.

9. The mask-programmable ROM of claim 8,
wherein the isolation gate electrode is formed of the same material as the first gate electrode and the second gate electrode.

10. The mask-programmable ROM of claim 8,
wherein the isolation gate electrode is disposed closer to the first bit line contact than to the first source contact.

11. The mask-programmable ROM of claim 8, further comprising:
- an active region overlapped with the first bit line contact, the second bit line contact, the first source contact and the second source contact,
- wherein each width of the bit line and the active region is greater than each width of the first bit line contact, the second bit line contact, the first source contact and the second source contact.

12. The mask-programmable ROM of claim 8,
wherein a width of the via structure is greater than a width of the second bit line contact.

* * * * *